(12) United States Patent
Bonam

(10) Patent No.: US 9,263,228 B2
(45) Date of Patent: Feb. 16, 2016

(54) INTEGRATED PHOTOEMISSION SOURCES AND SCALABLE PHOTOEMISSION STRUCTURES

(71) Applicant: INTERNATIONAL BUSINESS MACHINES CORPORATION, Armonk, NY (US)

(72) Inventor: Ravi K. Bonam, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 14/202,646

(22) Filed: Mar. 10, 2014

(65) Prior Publication Data

US 2015/0255241 A1  Sep. 10, 2015

(51) Int. Cl.
*H01J 37/073* (2006.01)
*H01J 1/34* (2006.01)
*H01J 9/12* (2006.01)
*H01J 37/317* (2006.01)

(52) U.S. Cl.
CPC ............... *H01J 37/073* (2013.01); *H01J 1/34* (2013.01); *H01J 9/12* (2013.01); *H01J 37/3174* (2013.01)

(58) Field of Classification Search
USPC ............................... 250/494.1, 493.1, 492.24
See application file for complete search history.

(56) References Cited

U.S. PATENT DOCUMENTS

| | | | |
|---|---|---|---|
| 4,460,831 A | 7/1984 | Oettinger et al. | |
| 4,820,927 A | 4/1989 | Langner et al. | |
| 5,698,452 A | * 12/1997 | Goossen | H04B 10/114 148/DIG. 135 |
| 6,057,639 A | 5/2000 | May et al. | |
| 6,215,128 B1 | 4/2001 | Mankos et al. | |
| 6,376,984 B1 | 4/2002 | Fernandez et al. | |
| 6,376,985 B2 | 4/2002 | Lee et al. | |
| 6,429,443 B1 | 8/2002 | Mankos et al. | |
| 6,538,256 B1 | 3/2003 | Mankos et al. | |

(Continued)

FOREIGN PATENT DOCUMENTS

WO  WO 2013/028650 A2  2/2013

OTHER PUBLICATIONS

Chen et al., "Collimating Diode Laser Beams from a Large-Area VCSEL-Array Using Microlens Array", IEEE Photonics Technology Letters, Vol. 11, No. 5, May 1999, pp. 506-508.

(Continued)

*Primary Examiner* — Kiet T Nguyen
(74) *Attorney, Agent, or Firm* — Scully, Scott, Murphy & Presser, P.C.; Daniel P. Morris, Esq.

(57) ABSTRACT

A scalable, integrated photoemitter device and method of manufacture using conventional CMOS manufacturing techniques. The photoemitter device has a first semiconductor substrate having a plurality of photonic sources formed on top in a first material layer, the plurality of photonic sources and the material layer forming a planar surface. A second substrate is bonded to the planar surface, the second substrate having a plurality of photoemitter structures formed on top in a second material layer, each photoemitter structure in alignment with a respective photonic source of the first substrate and configured to generate particle beams responsive to light from a respective light source. Additionally provided is a multi-level photoemitter of tapered design for implementation in the scalable, integrated photoemitter device. Conventional CMOS manufacturing techniques are also implemented to build the multi-level photoemitter of tapered design.

13 Claims, 10 Drawing Sheets

(56) References Cited

U.S. PATENT DOCUMENTS

| | | |
|---|---|---|
| 6,724,002 B2 | 4/2004 | Mankos et al. |
| 6,759,800 B1 | 7/2004 | Fernandez et al. |
| 6,812,461 B1 | 11/2004 | Adler et al. |
| 6,828,574 B1 | 12/2004 | Allen |
| 7,015,467 B2 | 3/2006 | Maldonado et al. |
| 7,161,162 B2 | 1/2007 | Maldonado et al. |
| 7,301,263 B2 | 11/2007 | Maldonado et al. |
| 7,446,474 B2 | 11/2008 | Maldonado et al. |
| 8,153,991 B2 | 4/2012 | Kruit |
| 2012/0224155 A1 | 9/2012 | Kruit |

OTHER PUBLICATIONS

Slot et al., "Mapper: High Throughput Maskless Lithography", Proc. of SPIE, vol. 6921, 69211P, (2008), downloaded from SPIE Digital Library on Mar. 19, 2010.

Petric et al., "REBL: A novel approach to high speed maskless electron beam direct write lithography", J. Vac. Sci. Technol. B 27(1), Jan./Feb. 2009, 2009 American Vacuum Society, pp. 161-166.

Platzgummer et al., "Projection maskless patterning for nanotechnology applications", J. Vac. Sci. Technol. B 26 (6), Nov./Dec. 2008, 2008 American Vacuum Society, pp. 2059-2063.

* cited by examiner

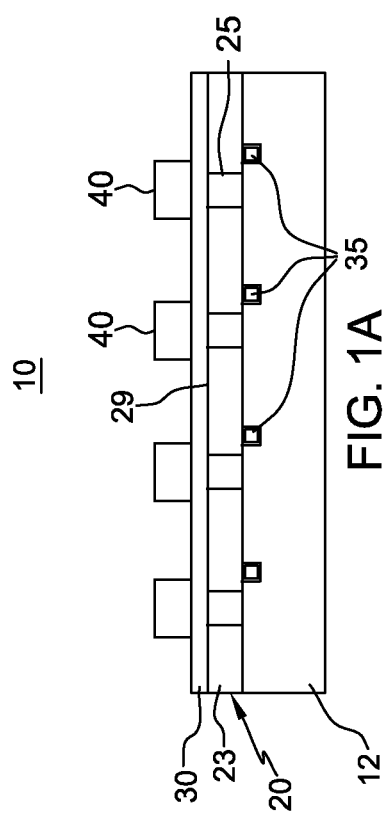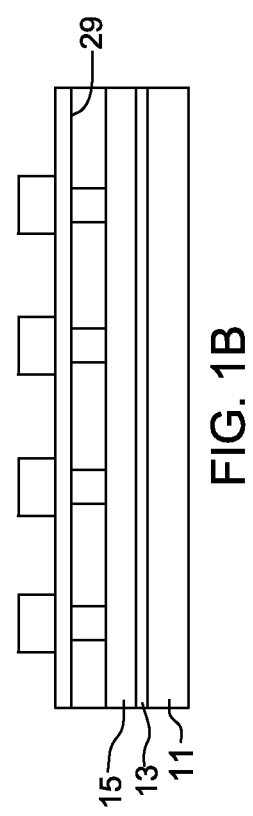

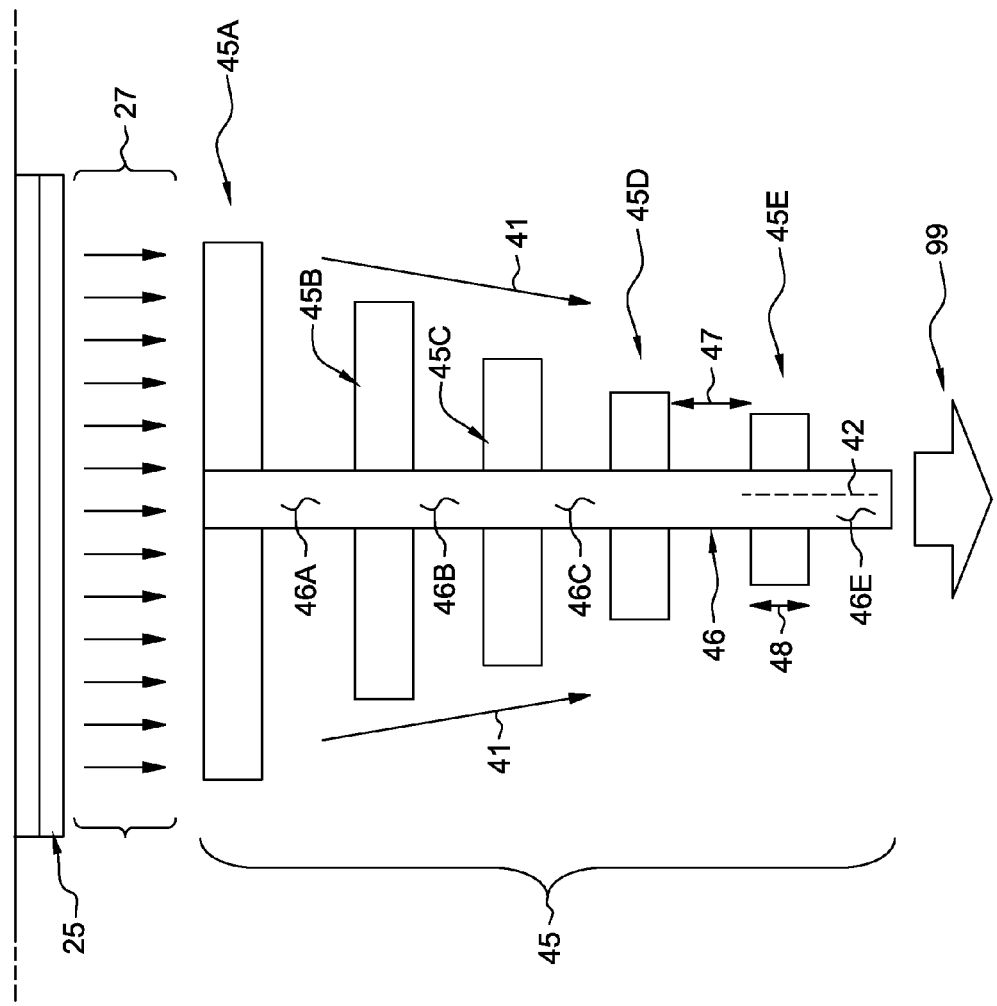

| EMITTER TYPE | PHOTOEMISSION |
|---|---|
| CATHODE MATERIAL | METALS (Ag, Cu etc.) |
| OPERATING TEMPERATURE [K] | 50-500 |
| CATHODE RADIUS [nm] | 10-100nm |
| EFFECTIVE SOURCE RADIUS [nm] | (2-10)* - 100nm |
| EMISSION CURRENT DENSITY [A/cm$^2$] | - |
| TOTAL EMISSION CURRENT [µA] | FEW nA |
| NORMALIZED BRIGHTNESS [A/cm2.sr.kV] | - |
| MAXIMUM PROBE CURRENT [nA] | FEW nA |
| ENERGY SPREAD @ CATHODE [eV] | 0.1-0.3 |
| ENERGY SPREAD @ GUN EXIT [eV] | 0.1-0.3 |
| BEAM NOISE [%] | 1 |
| EMISSION CURRENT DRIFT [%/h] | - |
| OPERATING VACUUM hPa/mbar$^{-1}$ | < 1 x 10$^{-10}$ |
| TYPICAL CATHODE LIFE [h] | > 1000 |
| CATHODE REGENERATION | NOT REQUIRED |
| SENSITIVITY TO EXTERNAL INFLUENCE | MINIMAL |

400

* VIRTUAL SOURCE; 1hPa= HECTOPASCALS = 100 Pa

FIG. 7

| Photocathode material | | Work function/ Ephotone (eV) | QE | λ (nm) | Operational lifetime | Vacuum (Torr) | Response time |
|---|---|---|---|---|---|---|---|
| | DC GaAs | | 5% | 527 | T1/e = 58 h | ~5·10⁻¹¹ | |
| 515 | GaAs (Cs) | | 1.5 - 6% | 750 | Short | 10⁻¹¹ | <ns |
| | GaN (CsO) | 3.4 | 20% | 300 | 10h + T1/2= 8H | 10⁻¹⁰ | |
| NEA | GaN (Cs) | <3.4 | 30% | 200 | | | |
| | Diamond | Large | >1% | <210 | Very long | | >ps |
| | Polycrystalline diamond | | 10⁻⁶ | 266 | Long | | |
| | Hydrogenated diamond | | 0.08% | 213 | | 10⁻⁶ | |
| | Nanostructured fullerine | | 0.002% | 213 | | 10⁻⁶ | |
| Internal field-assisted | Ag-O-Cs, Ag-B₃O Cu-O-Cs | Lowered by external bias | 15.7% enhanced | 510 | | | |
| Thermionic | | | | | | | |
| | LaB₆ | | 0.1% | 355 | ~ 1 d | <10⁻⁷ | |
| | Thermionic dispenser | | 0.23% | 266 | T1/2 = 12 h | 3*10⁻¹⁰ | <380 ps |
| | Trioxide termionic | | 0.035% | 266 | T1/2 =10 h | 3*10⁻¹⁰ | <400 ps |
| Ferroelectric | | | | | | | |
| | Ferroelectric | | 0.06% | 355 | Very long | 10^(-7) | <ns |
| | Ferroelectric ceramic | | 10⁻⁶ | | | | |

INTEGRATED PHOTOEMISSION SOURCES AND SCALABLE PHOTOEMISSION STRUCTURES

BACKGROUND

This disclosure relates generally to photoemission structures, and particularly to scalable photoemissive structures that are integrated in a semiconductor structure with a laser/light emitting source, and a method of making scalable photoemissive structures using CMOS semiconductor manufacturing techniques.

Photoemission is a process of extracting electrons or similar particle beams from a photoemissive material (e.g., metal, semiconductor, insulator) by using light (e.g., UV, Visible, IR). A major factor in this process is the use of efficient photoemissive structures to collect and concentrate the incident light.

A major problem for these structures is being manufacturable and scalable (in number and size) at the same time. Most prior art photoemitters are not manufacturable nor are they scalable to any great extent.

Moreover, some of the light sources have a common light source which can cause unnecessary heating of the surrounding substrate.

Some current architectures use a single electron source (Thermal Field Emission or Cold Field Emission) and split it into multiple beamlets. Current at the wafer level which translates into charge delivered, is a major throughput limiting factor for particle beam based lithography. The maximum current achievable by a single source is limited by space charge effects.

As throughput is a major challenge for particle beam based lithography due to serial nature of the process, to address these issues, multi-beam tools are currently being pursued. However, other drawbacks of the aforementioned architectures include system complexity and scalability.

SUMMARY

A scalable, integrated photoemissive structure for generating particle beams (e.g. small beams or rays also referred to as "beamlets").

The integrated light source and photoemission source structures produce beamlets that can be individually controlled by modulating the light source.

In a further aspect, the integrated light source and photoemission source structures are configured for increased scalability.

A method of manufacturing a scalable, integrated photoemission source and photoemissive structure for generating particle beams.

In one aspect, there is provided a scalable, integrated photoemitter device comprising: a first semiconductor substrate having a plurality of photonic sources formed on top in a first material layer, the plurality of photonic sources and the material layer forming a planar surface; and a second substrate bonded to the planar surface, the second substrate having a plurality of photoemitter structures formed on top in a second material layer, each photoemitter structure in alignment with a respective photonic source of the first substrate and configured to generate particle beams responsive to light from a respective light source.

In a further aspect, there is provided a method of forming a scalable, integrated photoemitter device comprising: forming a plurality of photonic sources on top of a first semiconductor substrate; providing a first material in spaces between the plurality formed plurality of photonic sources to form a first material layer on top the first substrate, planarizing the first material layer to form a planar surface; forming a layer of a second material on a surface of a second substrate; forming a plurality of photoemitter structures within the second material layer; bonding the second substrate having formed plurality of photoemitter structures to the planar surface of the first material layer, wherein each of the plurality of photoemitter structures are automatic located in alignment with a corresponding photonic source of the first substrate.

In a further aspect, there is provided a photoemitter comprising: a tapered multi-level structure formed in a material layer of a substrate, each level comprising a layer of photoemissive material and a connecting portion, the connecting portion for connecting to an adjacent photoemissive material layer of a next successive level, wherein a first photoemissive material layer of a first level is of a configuration having a first length or width dimension; and each successive layer includes a photoemissive material layer of successively smaller length or width dimensions.

There is also provided a method of making a plurality of photoemitters comprising: (a) applying a photoresist material layer to a top surface of a first material substrate and developing the resist to form a resist pattern; (b) etching the first material substrate to form a plurality of spaced apart trenches in the first material substrate according to the resist pattern, and removing the resist; (c) filling each trench with a sacrificial material and planarizing a surface of the substrate having the filled trenches; (d) depositing a layer of the first material on top the planarized surface; and (e) depositing a further layer of photoresist material to a top surface of the deposited first material layer; (f) applying a further photoresist material layer to a top surface and developing the resist to form a further resist pattern, and (g) etching the layer of first material according to the further resist pattern to form plural gaps in the further photoresist material layer, each of the gap in the further photoresist material layer in alignment with a corresponding the filled trench in the substrate; (g) removing through the gap sacrificial material in each filled trench; (h) filling each the trench and gap with a photoemissive material.

BRIEF DESCRIPTION OF THE DRAWINGS

These and other objects, features and advantages of the present invention will become apparent from the following detailed description of illustrative embodiments thereof, which is to be read in connection with the accompanying drawings, in which:

FIG. 1A shows an exemplary integrated photoemission structure 10 according to an embodiment;

FIG. 1B shows an exemplary integrated photoemission structure having a semiconductor-on-insulator (SOI) substrate;

FIG. 4B shows an operation of one single manufacturable, integrated photoemission source 45 and abutting light source 25;

FIG. 7 is a chart depicting typical electron source performance characteristics of example photoemissive source materials; and FIG. 8 shows a chart of materials including example NEA compounds that may be used as photoemitter material.

DETAILED DESCRIPTION

Figure 2:
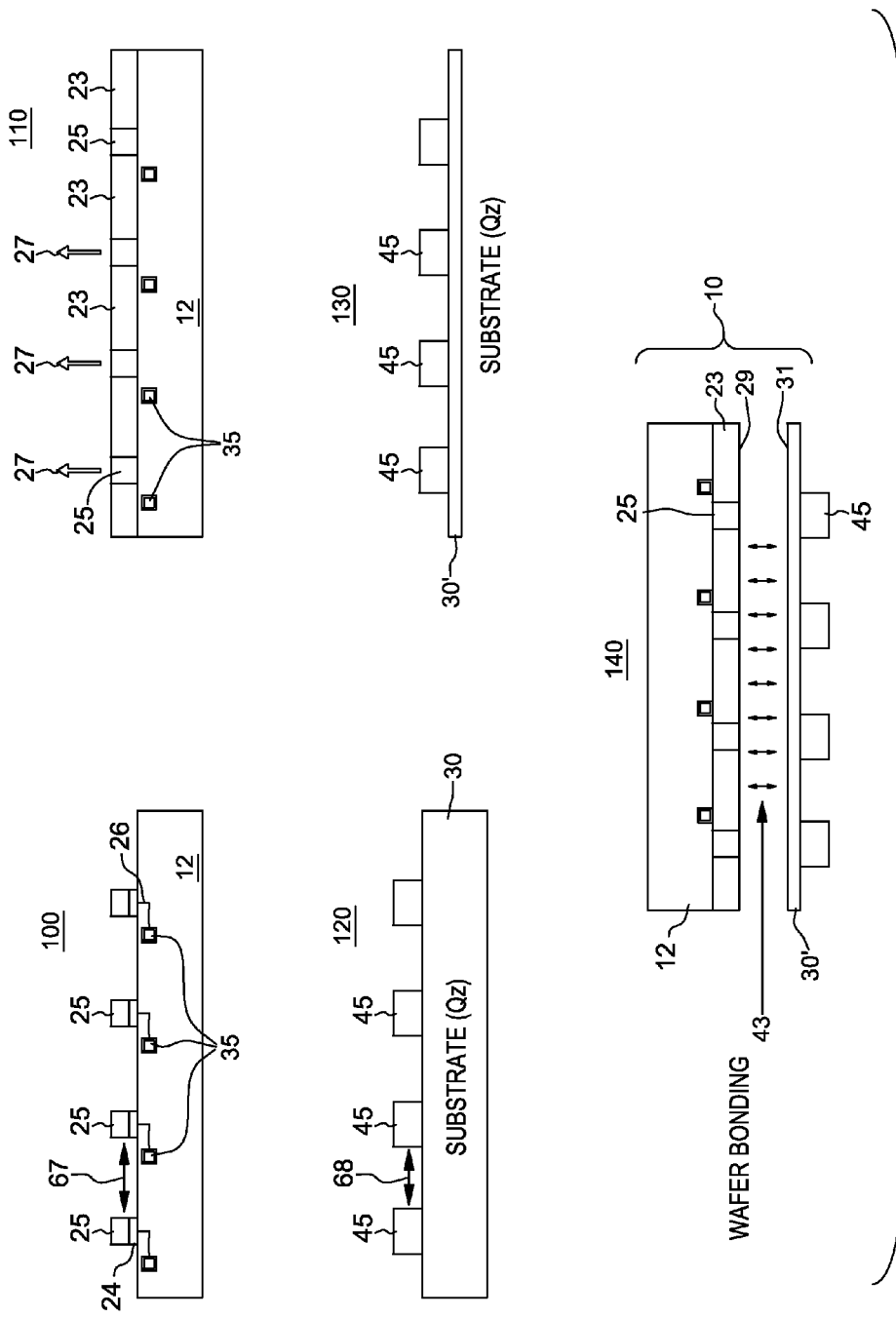
FIG. 2 shows steps for forming the exemplary integrated photoemission structure of FIG. 1A according to one embodiment.

There is provided a scalable, integrated phoeoemission structure for generating particle beams (hereinafter "beams" or "beamlets". These beams may comprise electrons or surface plasmons.

There is described a method for manufacturing a scalable, integrated photoemissive structure for generating particle beams using current CMOS manufacturing techniques including materials and vapor deposition, lithographic patterning, etching, chemical-mechanical polishing, etc.

While detailed embodiments of the present disclosure are described herein; however, it is to be understood that the disclosed embodiments are merely illustrative of the structures and methods disclosed herein. In addition, each of the examples given in connection with the various embodiments of the disclosure is intended to be illustrative, and not restrictive. Further, the figures are not necessarily to scale, some features may be exaggerated to show details of particular components. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "vertical", "horizontal", "top", "bottom", and derivatives thereof shall relate to the structures disclosed herein, as they are oriented in the drawing figures.

Referring to FIG. 1A, an exemplary integrated photoemission structure 10 according to an embodiment of the present disclosure includes a substrate 12. The substrate 12 as provided includes a semiconductor layer of semiconductor material such as silicon, however may include an insulator material, a conductor material, or a combination thereof. It further may comprise a stack of a semiconductor layer and an insulator layer as shown in FIG. 1B showing a semiconductor-on-insulator (SOI) substrate including a stack, from bottom to top, a handle substrate 11, a buried insulator layer 13 contacting a top surface of the handle substrate 11, and a top semiconductor layer 15 contacting the top surface of the buried insulator layer 13. The top semiconductor layer 15 as provided can include a semiconductor material that extends across the entirety of the buried insulator layer 13. In one example, the handle substrate 11 can include a semiconductor material such as silicon, an insulator material, a conductor material, or a combination thereof. If the substrate/handle substrate 11 includes a semiconductor material, the handle substrate 10 can be undoped or have a p-type doping or an n-type doping. The buried insulator layer 13 includes a dielectric material such as silicon oxide, $SiO_2$ and/or silicon nitride. For example, the buried insulator layer 13 can include thermal silicon oxide. The thickness of the buried insulator layer 13 can be from 5 nm to 1000 nm, and typically from 100 nm to 200 nm, although lesser and greater thicknesses can also be employed. The buried insulator layer 13 may, or may not, include multiple dielectric layers, e.g., a stack including at least a silicon oxide layer and a silicon nitride layer.

The top semiconductor layer 15 as provided in the SOI substrate of FIG. 1B can be a planar semiconductor material layer having a thickness from 5 nm to 1,000 nm. The semiconductor material in the planar semiconductor material layer 15 is may be a single crystalline semiconductor material. In another embodiment, the first semiconductor material can be germanium or a silicon germanium alloy. In yet another embodiment, the first semiconductor material can be single crystalline germanium or a single crystalline silicon germanium alloy. In still another embodiment, the first semiconductor material can be a polycrystalline material or an amorphous material.

Referring to more specific embodiments herein with respect to FIG. 1A, formed on top surface of the substrate 12 is a light source layer 20 including an opaque material such as an insulator, e.g., quartz 23. Alternatively, the insulator material may include any material that does not let light through. Integrated in this insulative, opaque material (e.g., quartz) light source layer 20 and formed a top of the substrate within the light source layer 20 are a plurality of light emitters (photon sources) such as semiconductor LEDs or a semiconductor diode based lasers 25, e.g., UV laser diodes, formed in the quartz material using CMOS manufacturing techniques. A single or two dimensional array of LED or laser diode light sources 25 may be formed integrated into the dielectric. Or they may be oriented according to a pattern.

As further shown in FIG. 1A, associated with each formed LED or laser diode light source 25 is a respective formed drive circuit which may include, for example, a thin film transistor (TFT) device 35 formed in or on the substrate adjacent and/or beneath the respective LED. Each formed thin film transistor (TFT) device 35 is connected to a respective corresponding diode light source 25 to control the emission and non-emission states of the photonic source 25.

As shown in FIG. 1A, using CMOS manufacturing techniques as known in the art, prior to or during formation of the light emitting diodes 25 in quartz layer 23, additional steps may be taken to form TFTs and associated drive circuitry/conductors (not shown) connecting formed drain, source and gate electrodes of each TFT device. Such drive circuitry is configured to connect to sources (not shown) that provide power, ground and drive signals to each respective TFT device. Drive circuitry connects the TFT to an anode/cathode of the corresponding light emitting diode 25 and is configured to activate/drive the light source 25. Thus, a plurality of light-emitting devices 25 and respective formed TFT devices 35 may be arranged in a row or matrix, i.e., in an in-plane direction. When activated, a plurality of respective TFTs 35 illuminate a respective abutting photoemission source as will be described herein.

As further shown in FIG. 1A are the respective abutting integrated photoemission structures 40 formed on a layer 30 atop of the light source layer 20. That is, within the same package/wafer and manufacturable as described herein, a further insulator layer 30 is formed on top of a surface of the light source layer 20 having embedded light sources 25. Then, formed on further insulator layer 30 are photocathode or like photoemissive structures 40 such that each photoemissive structures (an electron emitter or "photoemitter") is aligned with and abuts a respective light source 25 for reduced transmission losses. In one embodiment, the separation between the individual light source 25 and its abutting photoemission structure 40 corresponds to the thickness of insulator layer 30, and may range anywhere from between a few nanometers to 1.0 or several microns. The electron emitter (photoemitter) receives photons (input) and generates electrons (output) can be a metal, a semiconductor, a semi-metal, or an insulator.

In one embodiment, each electron photoemitter 40 comprises a material with a work function less than or equal to the energy of the photon source 25. For example, in one embodiment, metallic elements forming photocathode or photoemitter 40 may include Cadmium having an example work function of 4.07 electron Volts (eV); Copper having an example work function of 4.7 eV; Silver having an example work function of 4.73 eV; Tungsten having an example work function of 4.5 eV; and Zinc having an example work function of 4.3 eV. When using these photoemitter materials, in the embodiments described, example light (photonic) sources may include and LED generating light having wavelengths at 200 (nm) providing photonic energies of 6.253125 eV for example, or light having wavelengths at 200 (nm) providing photonic energies of 5.0025 eV, for example. Other metallic or nanoparticle materials as a photoemitter source may include but are not limited to: Aluminum, Beryllium, Calcium, Carbon, Cesium, Cobalt, Gold, Iron, Lead, Magnesium, Mercury, Nickel, Niobium, Potassium, Platinum, Selenium, Silver, and Sodium.

FIG. 7 is a chart 400 depicting typical electron source performance characteristics of photoemissive source material and emitter types.

As will be described herein below, due to the integrated nature of the source, alignment between laser/diode source 25 and photoemitter 40 is not required. Rather, alignment is obtained by any traditional alignment technique, e.g., four point alignment with translation, rotation, magnification corrections, etc.

FIG. 2 shows a method of manufacturing a scalable, integrated photoemission structure for generating particle (e.g., electron) beams such as integrated photoemission structure 10 shown in FIG. 1A, using current CMOS manufacturing techniques. FIG. 2 shows a step 100 including forming on a silicon substrate 12 a plurality of semiconductor light emitting sources 25, e.g., LEDs, scaled to achieve a particular density or pattern of particle emission. In one embodiment, the diode/laser light source 25 includes a III-V, e.g., a Nitride, or II-VI, e.g., ZnO, based materials. In one embodiment, current UV semiconductor diodes including AlGaN, InGaN may be formed. Laser diodes can be used to ensure efficient, longer operation. In one embodiment, there are formed LEDs that when activated produce light at wavelengths ranging from 13.5 nm to 300 nm, e.g., diodes providing light ranging between 200-250 nm wavelengths. Any manufacturable LED (light emitting diode) operable at UV, Visible and IR wavelengths may be used to provide photon energies that will exceed the metal work functions of its abutting photemitter. In one embodiment, as depicted at 100, the density or pitch 67 between adjacent formed UV diodes 25 ranges from micrometers to millimeters. Photolithographic techniques may be used to pattern the diode arrays.

In one non-limiting embodiment, the distance 67 between adjacent two diodes 25 (and hence adjacent photoemitters) may range on the order of hundreds of microns, e.g., between 200 and 400 microns. In one embodiment, the distance between adjacent diodes may be 300 microns. This spacing between the adjacent diodes (or adjacent photoemitters) is configurable and dependent upon the other peripheral components such as focusing elements following the emitter (not shown).

Then, in FIG. 2 at 110 there is depicted a step including filling, such as by materials deposition, gaps between each of the formed semiconductor light sources 25 with the opaque material 23, e.g., quartz, and thus forming light source layer 20. Thickness of the quartz material 23 is adjusted by processing to form a planar top surface 29 having the light sources of light source layer having 29. The quartz or like material 23 is opaque to the frequencies of light emitted and ensures that the light 27 transmitted from the sources 25 when activated, will only exit normal to the substrate and the light is contained in one direction. The formation of the light sources 25 for generating photons received at an abutting electron emitter and filling the gaps with opaque material is performed using current planar CMOS manufacturing techniques. The thickness of the opaque material must be as thick as the light source diode. The number, pattern and pitch of light sources 25 can be scaled based on application and the employed lithography, metrology, etc.

In a further embodiment, integrated within the processing depicted in FIG. 2 may include the manufacture of a substrate cooling system (not shown) for controlling temperature (i.e. cooling) the photoemission and light sources, e.g., based on the density of light sources. It is understood that although emission current from a single photoemission source is of the order of nA, multiple sources (e.g., a few 1000's) will generate cumulative current of the order of µA and the resulting chip may require a heat dissipation or cooling mechanism. An example cooling system may be implemented to cool the whole apparatus, or in one embodiment, a porous substrate may be implemented that is known to dissipate heat.

Then, integrated photoemission structures for generating particle beams, is formed using current CMOS manufacturing techniques as shown in FIG. 2 at 120 on a second substrate 30 (e.g., of a second wafer). It is understood that, depending upon intended Deep UV or Extreme UV lithographic system in which the present invention may be employed, the light transparent layer is typically a Qz material substrate, but it can be any material, e.g., ZnO. For purposes of discussion, in this step, substrate 30 is an ultra-thin (tens of nm) transparent material structure, e.g., Quartz, upon which there is formed using standard planar CMOS manufacturing (deposition, lithographic and etching) techniques, a plurality of photoemitters (electron emitters) 45. Techniques are implemented such that the number and pattern of electron emitters 45 (e.g., metal structures) exactly matches the pattern in pitch and density the number of formed light sources 25 on first substrate 12. In one embodiment, as depicted at step 120, the density or pitch 68 between adjacent formed photoemitters ranges from micrometers to millimeters.

Then, in FIG. 2 at step 130, after each photoemitter is formed on the quartz substrate using standard planar CMOS manufacturing techniques, using standard chemical-mechanical polishing steps, the back side of substrate 30 is polished/etched to achieve a very thin second substrate 30' ranging anywhere from a few nanometers to several microns in thickness. The thickness of the thinned transparent substrate 30' is such that the substrate be strong to withstand tensile forces or a fracture stress limitation and thin enough such that light passes through with no light transmission loss when integrated to abut a respective photon source.

Finally in FIG. 2, at 140, standard wafer bonding techniques are used to bond the bottom (underside) surface 31 of the thinned substrate 30' to the top surface 29 of the formed light layer above substrate 12 to form the integrated structure 10. Due to integrated nature of the light source, optical transmission losses or alignment issues will be reduced to a minimum. To bond the two substrates, an organic polymeric bonding/adhesive layer or like adhesive materials 43 is applied that may be used in a high temperature bonding or an adhesive bonding technique. The polymeric adhesive materials used may be a layer of up to a few nm thick, and include any transparent adhesive used to bond substrates as known in the art. Otherwise, any known chip-chip bonding process may be used to mate the transparent quartz substrate 30' with the formed photoemitters 45 to the top surface 29 of the formed light source layer 20 with the formed light sources 25. While the adhesive layer is transparent, in one embodiment, the bonding/adhesive layer does not need to be as transparent as Qz layer 30.

For example, using a bonding assembly, the first Si substrate 12 having light source layer 20 may be held in a first fixed orientation and the underside 31 of second substrate 30' aligned in the same orientation in registry with the first substrate and is lowered onto the top surface 29 of layer 20. The second substrate 30' may be aligned and placed atop of the first substrate 20 by moving the second substrate 30' keeping the first substrate 12/20 fixed, or alternatively, by moving the first substrate 12/20 and keeping the second substrate 30' fixed.

Figure 3:
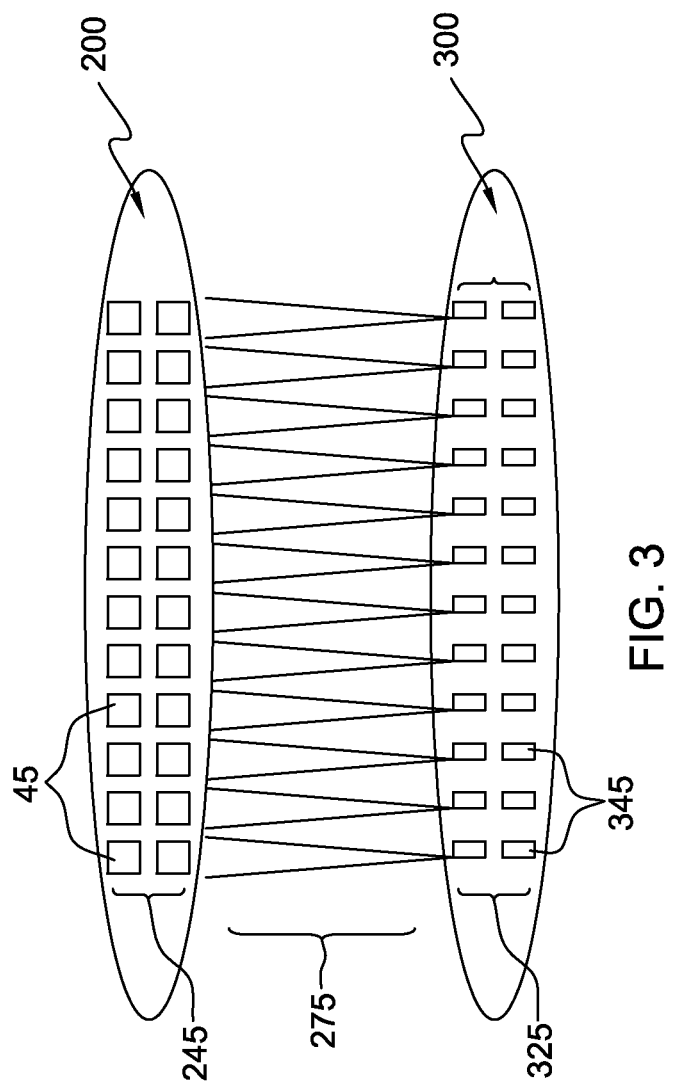
FIG. 3 shows use of an array of scalable, integrated photoemitter structures in a manufacture step implementing automatic alignment of multi-beam patterning without moving the wafer.

FIG. 3 shows use of the scalable, integrated photoemitter structures and particularly a conceptual illustration depicting multi-beam patterning without moving the wafer. Formed Photoemitters 45 forming a photoemitter array 245 on substrate 200 are programmed to write patterns 325 to second wafer 300 in parallel without any stage movement. This reduces overlay, stage related pattern placement errors. This multibeam patterning capability is scalable to larger wafers e.g., 450 mm$^2$, while maintaining high resolution offered by electron beams. In the FIG. 3 the first wafer 200 provides large scale manufacture of individually actuable electron beam (i.e., photoemissive) sources 245 over a large area (>200 mm$^2$, such as 450 mm$^2$). It is understood that the coverage may be smaller than 200 mm$^2$. In one embodiment, the array of photoemissive sources 245 can be formed as a square or rectangular grid, or it could also be provided on a hexagonal grid for higher packing density, or on some other grid geometry. The laser diode pattern/density may support multiple beamlet configurations 275 for simultaneous writing in parallel. For current manufacturable wafers 200, up to hundreds of thousands of integrated photoemissive structures 45 can be manufactured. These structures can be directly mapped to form corresponding patterns 325 when forming structures onto another wafer structure 300. For example, as shown in FIG. 3 there is depicted first wafer 200 having multiple integrated sources writing multiple parallel beamlets 275 to individual die locations 345 on the second substrate of a second aligned wafer 300 while maintaining high resolution offered by electron beams. The position of the wafers 200 and 300 do not have to be moved so overlay errors are eliminated. Thus, manufacturing throughput is greater and overlay errors reduced as alignment issues are minimized due to the one source 200 to one die 300 mapping, requiring no stage movement and thereby minimizing stitch errors.

Figure 4A:
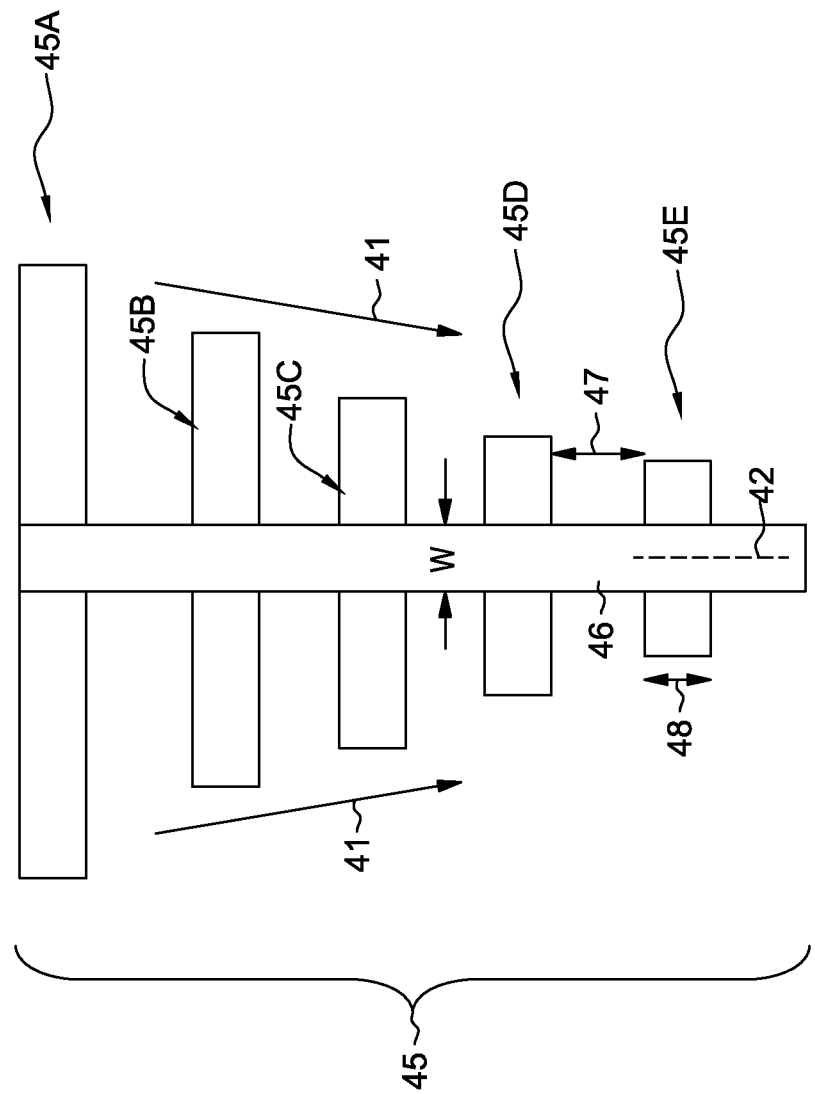
FIG. 4A shows a cross-sectional view of an embodiment of a photoemission source (electron emitter) 45 such as shown in FIGS. 1-3.

FIG. 4A shows one embodiment of a single manufacturable, scalable and integrated photoemission source 45 produced on wafer 300 and particularly a detailed cross-sectional view of an embodiment of a photoemission source (electron emitter) 45 such as shown in FIGS. 1-3.

FIG. 4B shows one single manufacturable, scalable and integrated photoemission source 45 and abutting light source 25 after bonding produced wafers 200, 300.

In each of the embodiments depicted, the photoemitter 45 is a metal or any photoemissive material structure, i.e., comprising metal nanoparticles, semiconductor, semimetal (i.e., a metal exhibiting a higher resistance, e.g., a group III material such as gallium that may have less than 100 ohms), or an insulator. In one example implementation, the quantum efficiency of the material, i.e. number of electrons emitted per a received photon, for metals, is of the order of $10^{-4}$ (i.e. one electron per 1000 photons); other photoemitter materials such as semiconductors and negative affinity materials may be used. The chart 300 of FIG. 7 shows some properties of photoemissive sources such as Silver and Copper which can be used in one embodiment. Metals such as silver and copper are known to be good and stable photoemitters requiring UV light for emission. Typically, the greater the quantum efficiency of the device, the better the photoemitter. Noble metals are good because they typically do not oxidize and thus avoid changing property of the emitter.

In FIGS. 4A and 4B, the photoemitter 45 is a three-dimensional structure of a metal or like photoemmissive material. It could be a two-dimensional structure as well. In one embodiment, the structure 45 includes one or more layers 45A-45E of emissive material such that each formed layer 45A-45E of the photoemissive material structure 45 is of disc or circular shaped geometry as shown by the top view of a photo emitter layer 45 in FIG. 4C. Each layer 45A-45E is formed within a dielectric material, e.g., a translucent or transparent material. The translucent dielectric material is Quartz in the embodiment described herein. In the structure of FIG. 4A, between each layer 45A-45E are formed intermediate portions 46A, 46B, etc. of like photoemissive material, forming a centralized structure 46. These centralized connecting portions are of smaller diameter than any metal layer, and is shown connected at or near a center at each level.

Figure 5:
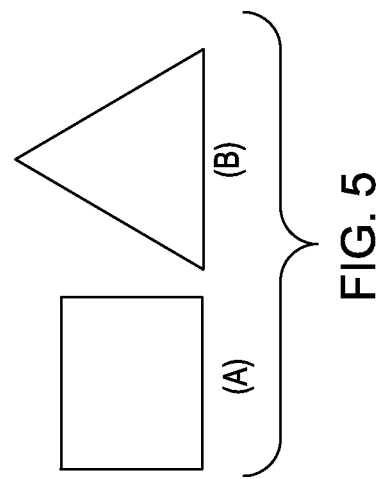
FIG. 5A shows a top view of the photoemission source layers as a square shaped geometry and FIG. 5B shows a top view of the photoemission source layers as a triangle shaped geometry as the layer geometries for the photoemission source of FIG. 4A.

In one embodiment, the three-dimensional metal structure 45 shown is of a tapered geometry (having a defined slope) wherein, in the cross-sectional view shown in FIG. 4A, a first formed bottom layer 45A is of a first largest diameter, and intermediate layers of successively smaller diameter are successively formed culminating in a final formed top layer 45E and central portion 46E of a smallest diameter. It is understood that, the layers of the photo emitter structure 45 may be of other geometric configurations: e.g., a square structure or rectangle structure (FIG. 5A), or triangular structure as in FIG. 5B. It is understood that the embodiment of photoemitter 45 is exemplary; other photoemissive structures of like designs may be integrated in the device of FIG. 1A. Further, the embodiment as depicted is not limited to the number and size of layers as shown. The number of layers is dependent on transparency of the photoemitter material. As all light is to be converted to electrons, the structure of the emitter increases photoemitter efficiency. The structure of FIG. 4A shows one embodiment for improving efficiency; there can be different structural modifications.

In a further embodiment, the geometric configuration of the photoemission device layers may be matched or tailored to the type and/or geometry of the corresponding abutting integrated light emitting source (e.g., UV laser diode 25) as shown in FIG. 4B.

Figure 4C:
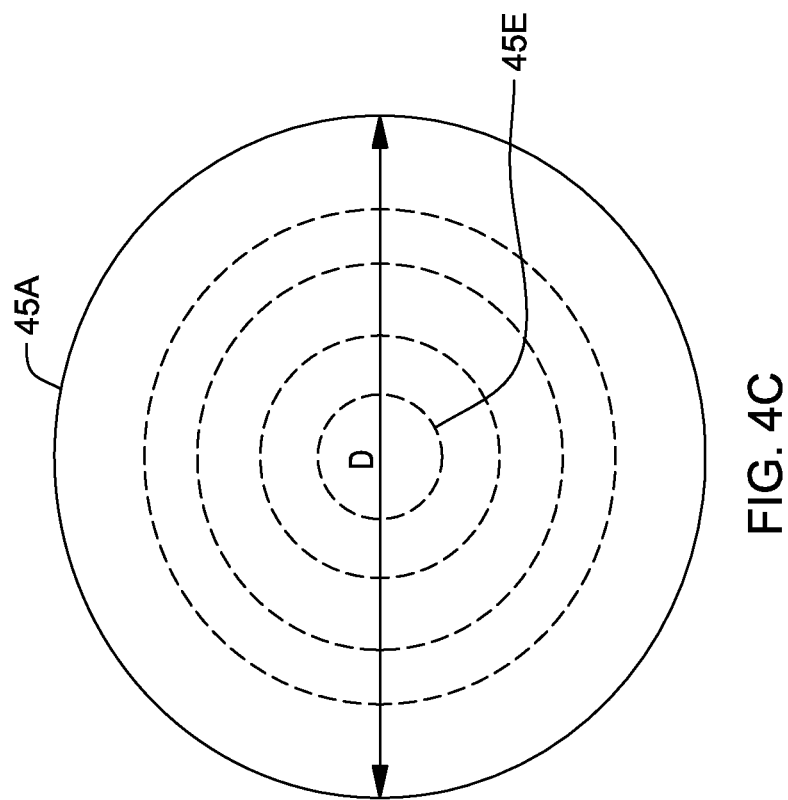
FIG. 4C shows a top down view of the photoemission structure 45 of FIG. 4A having disc-shaped layers with the bottom layer 45A having diameter "d" shown relative to the successively reduced diameters of each remaining successive layer in broken lines.

In FIG. 4C there is shown a top down view of the photoemission structure 45 of the tapered embodiment shown in FIG. 4A having circular (disc) shaped layers ("lamellae") with the bottom layer 45A shown having diameter "d" relative to the successively reduced diameters of each remaining successive layers shown in broken lines. Diameters "d" of each of the disc-shaped layers in the cross sectional view of FIG. 4A may range in length anywhere from tens ($10^1$) of nm to 1.0 micrometer, e.g., from 10 nm to 500 nm, to generate similar electron beam emissions (beamlets) of similar diameters. The disc-shaped layers have diameters ranging from a few microns to few tens of nanometers is configurable to enable optimum focusing of the light from the diode.

In the embodiment shown in FIG. 4B, the "bottom" photoemissive structure layer 45A has a largest diameter for receiving the maximum light intensity from a corresponding integrated light source 25 as the diode is larger than the photoemitter. The photoemmissive portion indicated by a first photoemitter metal layer 45A abuts a corresponding light source, i.e., is separated by a small distance corresponding to the thickness of substrate 30 bonded thereto. Each successive layer 45B-45E has a respective successively smaller diameter, with the diameter at the "top" layer 45E of the photo emitter 45 being the smallest diameter. It is understood that while a photoemitter 45 is shown having five (5) layers, it is contemplated that other tapered designs (e.g. having different taper geometry slopes) may be implemented with more or less layers. Further, other one, two or three-dimensional designs may be manufactured.

As will be described in detail herein below, lithography steps in the manufacturing process flow determines the size of the discs.

The integrated photoemission sources can be shaped in alternate ways to generate shaped particle beams or beamlets. However, with the formed layers of successively decreasing diameters, photon collection and focusing is maximized as electron beams indicated by arrows 41 in FIG. 4B are shown concentrating towards a central axis 42 defined by the centralized conductor 46 of the structure 45. That is, the geometry of the integrated photoemitter structure of FIGS. 4A and 4B in the embodiment described is such that it collects a maximum amount of photons from directed light 27 generated by the respective light source, i.e., an activated abutting laser diode 25, over a larger area, and focuses them into a smaller area by generating surface plasmons which can focus light through sub-wavelength structures. Thus the maximized light collection is concentrated from bottom layer 45A to the top layer 45E, concentrating the resulting generated particle beam 99.

More particularly, the photoemitter structure of tapered design with the dimensional characteristics as described focuses photons by generating surface plasmons which focus light through sub-wavelength structures which structures are of the dimensions smaller than the wavelength of incident light. Any of the free standing "lamellae" 45A-45E can be sub-wavelength structures. The plasmons (quantized oscillations (like photons)) of electrons in a metal are usually surface related and occur at a metal dielectric material interface, i.e., the metal layers with quartz. Due to this surface effect and the fact that they are predominant at the metal and dielectric interface, these plasmons concentrate to the center of the geometry (e.g., circle) and hence can be focused.

Thus the dimension and size of the photoemissive material structures shown in the view of the structure 45 in the embodiment of FIG. 4B may be tailored to control the corresponding area of particle (beamlet) emission based according to the wavelength of incident light from the abutting integrated light source. As mentioned, in one embodiment, the distance 47 between any two adjacent metal layers of structure 45 is designed to be on the order of a wavelength of the light received from a corresponding light source. In one embodiment, the thickness 48 of each lamella of photoemissive material 45A-45E is of the order of 1 to 2 times the wavelength ($\lambda$) of the light received from a corresponding light source and can range between 1 nm-few 100 nm. The width of the trunk 46 is of similar size range.

While each formed layer of photoemitter material (nanoparticle or the active part of the nanostructure) is not transparent, it is configured to completely absorb light from its corresponding diode as shown in FIG. 4B and convert the light to electrons. As the "nanostructure" is of a tapered or tree-like geometry, light is focused to the active part of the structure. Thus, in one embodiment, the tapered structure allows a concentration of light to the active photoemissive material, e.g., which can be placed on the smallest disc, e.g., disc 45E of FIG. 4B, to keep electron beam 99 spot size to a minimum.

In a further embodiment, a high performance photoemitter design such as shown in FIGS. 4A, 4B has an ultrathin (e.g., 50 Ang.) metal quantum well-like structure for enhanced internal photoemission, and has surface plasmon enhanced bandgap excitation, and in particular, grating and edge assisted surface plasmon excitation. That is, at the interface of the emitter and diode there can be surface plasmons generated (along the interface) and can be directed based on geometry of the structure. Circular geometry allows them to propagate to the center.

In further embodiments, compounds with negative electron affinity (NEA) can also constitute or comprise a part of the photoemitter structure. Example NEA compounds are shown in the rows 515 shown in the chart 500 of FIG. 8 including those having Cesium (Cs) deposited on the surface.

In further embodiments the photoemitter structure 45 can be designed such that it dissipates heat. That is, the structure 45 will dissipate heat because of it geometry and air gap between lamellae 45A-45E as a heat sink.

Figure 6A:
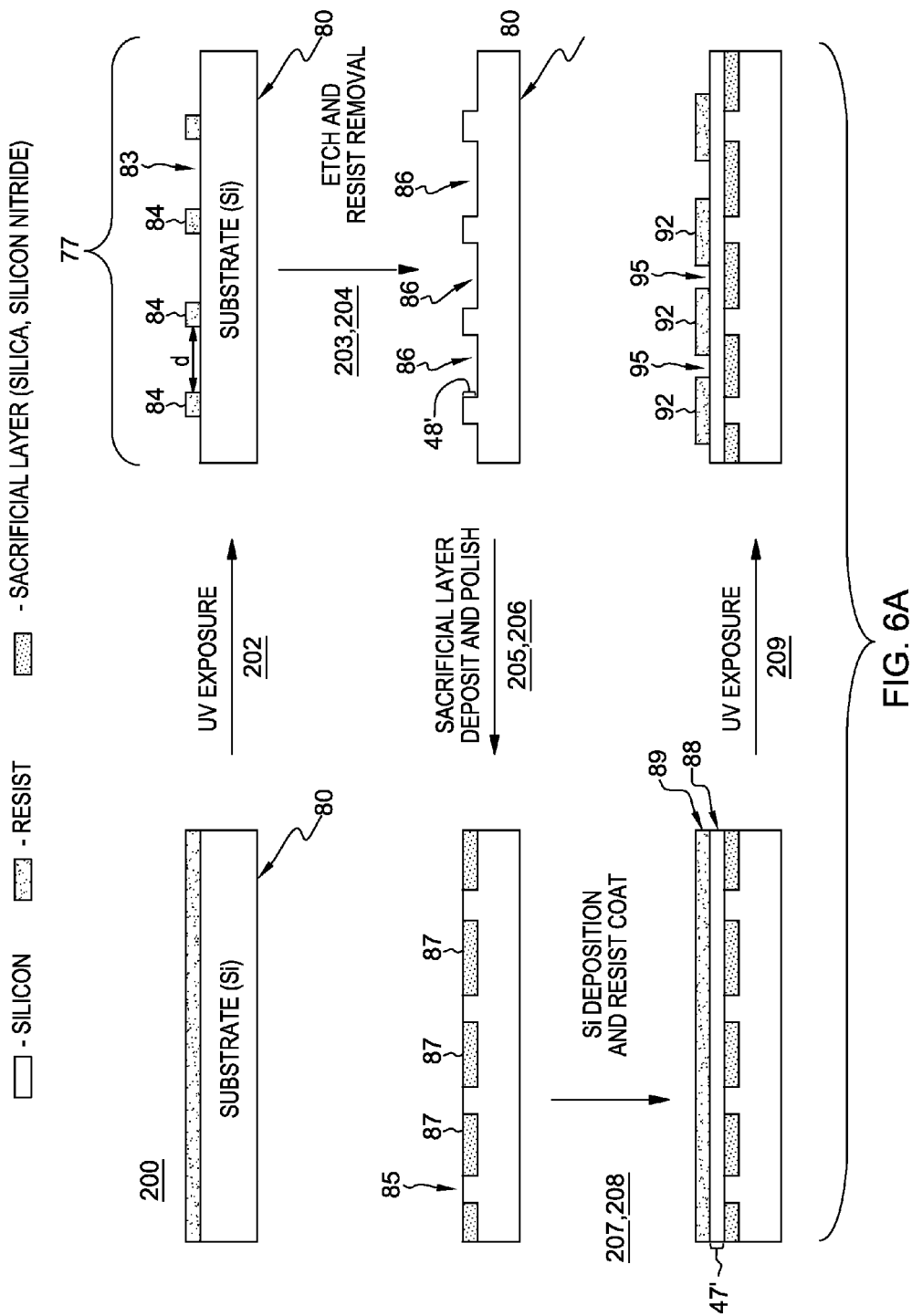
FIGS. 6A-6B depict a process for manufacturing one level (corresponding to one layer and) of the photoemissive structure 45 of FIG. 4A according to one embodiment.
Figure 6B:
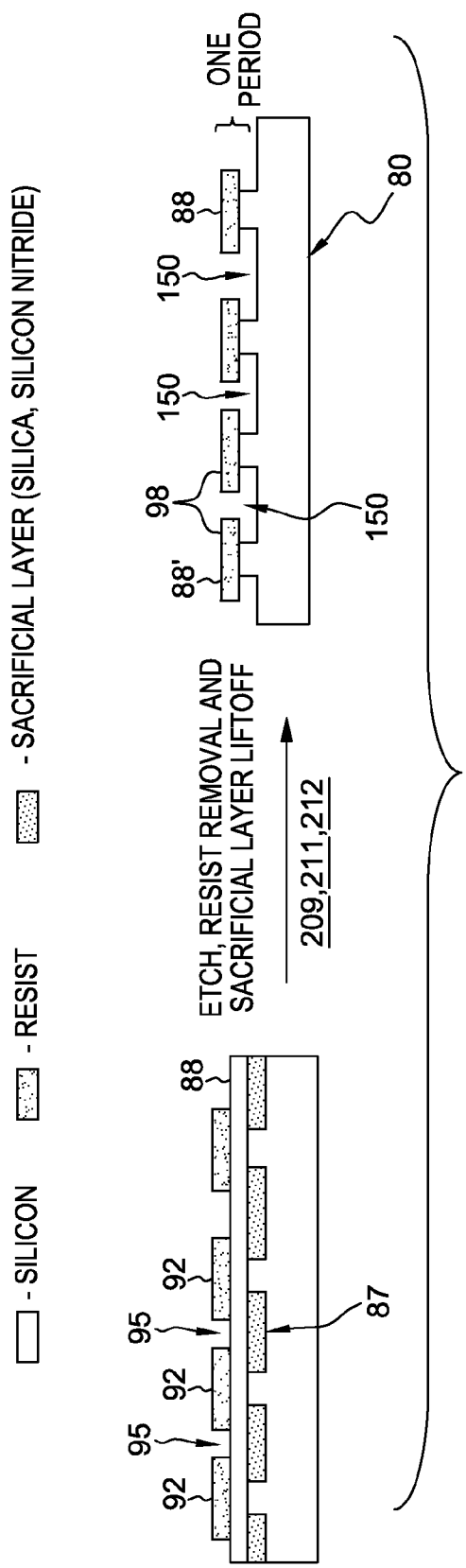

FIGS. 6A-6B depict a process for manufacturing one level (corresponding to one layer) of the photoemissive structure 45 of FIG. 4 using planar CMOS manufacturing techniques. In one embodiment, the steps depicted in FIG. 6A, 6B are performed in an iterative fashion, i.e., are repeated to form each successive layer 45A-45B of the structure of FIG. 4. In FIG. 6A, to manufacture the level corresponding to bottom layer 45A, for example, there is performed laying down in a lithography step 200, applying a layer 82 of photoresist material to the top of an insulator substrate 80, which may be transparent material such as quartz as described in the embodiment herein.

Performed lithography steps includes forming the photoresist (as shown) on the topmost surface of the substrate 80, exposing the photoresist to a desired pattern of radiation, and then developing the exposed photoresist with a resist developer to provide a patterned photoresist 77 atop the substrate material surface.

That is, as a result of the resist applying and developing lithography steps, a pattern comprising a plurality of resist structures 84 spaced apart by gaps 83 is formed as shown in FIG. 6A. In the manufacture of a first layer of the device 45, the width of the gap 83 or distance between formed resist structures 84 corresponds to the diameter "d" of the formed (in the case of a circular geometry) layer of the photoemission structure 45 of FIG. 4, e.g., layer 45A, or alternatively a width or length dimension of the photoemissive layer. For example, the width of the gap 83 (i.e., distance between formed resist structures 84) corresponds to the length of a side of a layer of the structures shown in FIGS. 5A, 5B.

Then, at least one etch is then employed at 203 which transfers the pattern from the patterned photoresist into the substrate material. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the substrate material, the patterned photoresist 77 is removed at 204 utilizing a resist stripping process such as, for example, ashing.

In particular, as shown in FIG. 6A, as a result of etching 203 for pattern transfer results in shallow trench regions 86 formed within the substrate 80 of length corresponding to diameter "d" of a formed photoemissive layer. In one embodiment, the etching is performed to result in trenches 86 of a depth 48' corresponding to a thickness 48 of the eventually formed layer 45A-45E of photoemissive material. In one embodiment, this layer thickness ranges on the order of 1 to 2 times the wavelength ($\lambda$) of the light received from a corresponding light source. It is the case that the length of the formed trench portion 86 corresponds in length of a layer 45A-45E of the device as described herein with respect to FIG. 4A. These etching steps may be performed by one of a variety of techniques such as reactive ion etching, wet etching, dry etching or a combination thereof.

In a further sacrificial layer deposit step 205 of FIG. 6A, a sacrificial material 87, e.g., a dielectric material such as silica, silicon nitride, is deposited within each formed shallow trench region 86. Then, a polish step 206 is performed to form a level surface 85.

Two additional steps 207, 208 may be performed including a blanket deposition of a layer 88 of an Si-based material, e.g., polySilicon. This may include method steps of depositing or epitaxially growing silicon (usually single crystal) atop surface 85 at 207, and at 208, a further blanket deposition of a photoresist layer 89 atop layer 88. Deposition techniques include, but are not limited to: chemical vapor deposition (CVD), plasma-enhanced chemical vapor deposition (PECVD), and sputtering. In one embodiment, the thickness 47' of dielectric layer 88 corresponds to the distance 47 between any two adjacent photoemissive layers of structure 45 as shown in FIG. 4A. In one embodiment, this is designed to be on the order of a wavelength of the light received from a corresponding light source, e.g. between 1 nm to a few 100 nm.

Then, in FIG. 6A, further steps include an exposure step 209 in which the photoresist is first exposed to a pattern of radiation such as UV light, and a step of developing the exposed photoresist using a conventional resist developer. In this step, a patterned mask (not shown) may be first formed atop the resist layer 89 to expose portions thereof using conventional techniques well known to those skilled in the art including, for example, lithography. After developing the resist, an etching step is performed to remove portions of the resist according to a pattern in which there remains a plurality of resist structures 92 and alternating trenches 95. The patterning is conducted such that each formed trench 95 is in alignment with and overlaps in one to one correspondence with a shallow trench filled with the sacrificial material 87 previously formed underneath. The width of each formed trench corresponds to the width "w" of the central portions, e.g., portion 46A of the photoemitter 45 shown in FIG. 4A.

Further steps are shown in FIG. 6B where from the structure shown formed as a result of step 209 in FIG. 6A, including at 210 performing a wet or dry etching to remove the dielectric material portions of layer 88 resulting in gaps 98 of the layer 88; and at 211, removing the remaining resist layer portions 96. Then at 212, liftoff processes are performed via gaps 98 to remove the filled sacrificial layer portions 87. These process steps 210-212 result in formed access portion 150 in the substrate 80, the access portions 150 shown as an inverted "T" in the cross-sectional view shown. Each access portion 150 can then be filled with a photoemissive material such as metal nanoparticles, semiconductor, semimetal or an insulator during or in further steps to form single photoemissive layer 45A and central portion 46A of the structure 45.

The steps 200-212 shown and depicted in FIGS. 6A and 6B represent one manufacturing period of a single inverted T structure 150 formed in a Quartz substrate and filled with photoemissive material. These 12 steps as shown in FIGS. 6A, 6B, using conventional CMOS manufacturing techniques, are repeated successively to build a layer at each successive level: single photoemissive layer 45A and central layer portion 46A shown in the structure 45 of FIG. 4A are built; layer 45B and central layer portion 46B in period 2 build atop layer 46A, layer 45C and central layer portion 46C in period 3 build atop layer 46B, etc. In the embodiment depicted, the width "d" dimension of trenches 86 formed in the substrate at steps 203, 204 of FIG. 6A at each successive layer being built in each successive period will successively decrease in size to result in the tapered photoemitter design shown in FIG. 4A. In each successive period, the width "w" defining central portion width may remain the same. In one embodiment, the defined central portion width may change in geometry for each successive built layer.

Further, while steps shown in FIGS. 6A and 6B are demonstrated to form a single integrated photoemissive structure in a translucent or transparent substrate on a wafer (such as shown in FIG. 3), it is understood that an array of such structures are simultaneously patterned and formed on the wafer shown in FIG. 3 using CMOS manufacturing techniques as described.

A major advantage of arrays of integrated photoemission structures (light source and photoemitter) is the ease of manufacturing and the reduction of alignment issues. It makes the system scalable and reduces tool complexity resulting in the ability of providing massively parallel write operations, and inspection capabilities.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A scalable, integrated photoemitter device comprising:
   a first semiconductor substrate having a plurality of photonic sources formed on top in a first material layer, said plurality of photonic sources and said material layer forming a planar surface;
   a second substrate bonded to said planar surface, said second substrate having a plurality of photoemitter structures formed on top in a second material layer, each photoemitter structure in alignment with a respective photonic source of said first substrate and configured to generate particle beams responsive to light from a respective light source.

2. The scalable, integrated photoemitter device of claim 1, wherein the first material layer comprises an opaque material.

3. The scalable, integrated photoemitter device of wherein the second substrate and said second material layer comprise a translucent or transparent material.

4. The scalable, integrated photoemitter device of claim 1, wherein said first material layer and said second substrate and second material layer comprise Quartz.

5. The scalable, integrated photoemitter device of claim 1, wherein said plurality of photonic sources comprise a light emitting diode light source or UV laser diode light source.

6. The scalable, integrated photoemitter device of claim 1, wherein said photoemitter structures comprise a photoemissive material formed of a metal, semiconductor material, or semimetal or metal nanoparticle materials dimensioned to receive a light from a corresponding photonic source.

7. The scalable, integrated photoemitter device of claim 1, further comprising: a drive circuit associated with each photonic source of said plurality of photonic sources, each drive circuit connected to a corresponding photonic source and configured to provide signals for actuating that photonic source.

8. A method of forming a scalable, integrated photoemitter device comprising:
 forming a plurality of photonic sources on top of a first semiconductor substrate;
 providing a first material in spaces between said plurality formed plurality of photonic sources to form a first material layer on top said first substrate,
 planarizing said first material layer to form a planar surface;
 forming a layer of a second material on a surface of a second substrate;
 forming a plurality of photoemitter structures within said second material layer;
 bonding said second substrate having formed plurality of photoemitter structures to said planar surface of said first material layer, wherein each of said plurality of photoemitter structures is automatic located in alignment with a corresponding photonic source of said first substrate.

9. The method of claim 8, wherein the first material layer comprises an opaque material.

10. The method of claim 8, wherein said plurality of photonic sources comprises a light emitting diode light source or UV laser diode light source.

11. The method of claim 8, wherein said photoemitter structures comprise a photoemissive material formed of a metal, semiconductor material, or semimetal or metal nanoparticle materials.

12. The method of claim 8, wherein the second substrate and said second material layer comprise a translucent or transparent material.

13. The method of claim 8, further comprising:
 forming in said first substrate, a drive circuit associated with each photonic source of said plurality of photonic sources, each drive circuit configured to provide signals for actuating a respective photonic source.

* * * * *